United States Patent [19]

Kihara

[11] Patent Number: 5,109,505
[45] Date of Patent: Apr. 28, 1992

[54] SEMICONDUCTOR MEMORY DISK APPARATUS WITH BACKUP DEVICE CAPABLE OF BEING ACCESSED IMMEDIATELY AFTER POWER SOURCE IS RECOVERED

[75] Inventor: Jyun-ichi Kihara, Tachikawa, Japan

[73] Assignee: Kabushiki Kaisha Toshiba, Kawasaki, Japan

[21] Appl. No.: 413,707

[22] Filed: Sep. 28, 1989

[30] Foreign Application Priority Data

Sep. 29, 1988 [JP] Japan .................... 63-242232

[51] Int. Cl.⁵ ............................................ G06F 11/20
[52] U.S. Cl. ............................ 395/575; 364/273.4; 364/268.5; 364/DIG. 1; 364/943.91; 364/948.5; 364/DIG. 2; 365/228; 365/229; 371/10.1; 371/66
[58] Field of Search ............ 364/200, 900; 371/66, 371/10.1, 13, 68.1; 365/228, 229

[56] References Cited

U.S. PATENT DOCUMENTS

| | | | |
|---|---|---|---|
| 3,544,777 | 12/1970 | Winkler | 371/10.1 |
| 4,327,410 | 4/1982 | Patel | 365/228 X |
| 4,348,729 | 9/1982 | Sasayama | 365/228 X |
| 4,393,500 | 7/1983 | Imazeki | 371/13 |
| 4,584,663 | 4/1986 | Tanikawa | 371/10.1 X |

OTHER PUBLICATIONS

"Fault-Tolerant Battery Back-Up Power System for Controlling I/O Devices for Continuous On-Line Transactions", IBMTDB, vol. 32, No. 5B, Oct. 1989, pp. 15-18.
Nikkei Electronics, Mar. 11, 1985, pp. 159-187.
Hitachi Hyoron, Takashi Oka et al., UDC 681.327.2.021.025, pp. 67-70.

*Primary Examiner*—Robert W. Beausoliel
*Attorney, Agent, or Firm*—Cushman, Darby & Cushman

[57] ABSTRACT

In a semiconductor memory disk apparatus, when a read command is input as an input/output request during a restore operation, if a flag in a directory memory corresponding to the requested block is not set, data in a requested block is read out from a backup unit, and is written in the corresponding block of a semiconductor memory. At the same time, the readout data is transferred to a designated destination. Thereafter, the flag in the directory memory corresponding to the requested block is set. However, if the flag in the directory memory corresponding to the requested block is set, the requested data is read out from the semiconductor memory, and is transferred. When a write command is input as the input/output request during a restore operation, the data is written in a designated block of the semiconductor memory and the same data is also written in the corresponding block of the backup unit. In this case, the flag in the directory memory corresponding to the requested block is set.

18 Claims, 5 Drawing Sheets

BACKUP UNIT (100 KB) — 22

| 1 | 2 | 3 | 4 | 5 | 6 | 7 | 8 | 9 | 10 |
|---|---|---|---|---|---|---|---|---|---|
| 11 | 12 | 13 | 14 | 15 | 16 | 17 | 18 | 19 | 20 |
| 21 | 22 | 23 | 24 | 25 | 26 | 27 | 28 | 29 | 30 |
| 31 | 32 | 33 | 34 | 35 | 36 | 37 | 38 | 39 | 40 |
| 41 | 42 | 43 | 44 | 45 | 46 | 47 | 48 | 49 | 50 |

1 BLOCK ; 2KB

F I G. 5 A

SEMICONDUCTOR MEMORY (100 KB) — 21

| 1 | 2 | 3 | 4 | 5 | 6 | 7 | 8 | 9 | 10 |
|---|---|---|---|---|---|---|---|---|---|
| 11 | 12 | 13 | 14 | 15 | 16 | 17 | 18 | 19 | 20 |
| 21 | 22 | 23 | 24 | 25 | 26 | 27 | 28 | 29 | 30 |
| 31 | 32 | 33 | 34 | 35 | 36 | 37 | 38 | 39 | 40 |
| 41 | 42 | 43 | 44 | 45 | 46 | 47 | 48 | 49 | 50 |

1 BLOCK ; 2KB

F I G. 5 B

DIRECTORY MEMORY (50 B) — 23

| 1 | 1 | 1 | 1 | 1 | 1 | 1 | 1 | 1 | 1 |
|---|---|---|---|---|---|---|---|---|---|
| 1 | 1 | 1 | 1 | 1 | 1 | 1 | 1 | 1 | 1 |
| 1 | 1 | 0 | 0 | 0 | 0 | 0 | 0 | 0 | 0 |
| 0 | 0 | 0 | 0 | 0 | 0 | 0 | 0 | 0 | 0 |
| 0 | 0 | 0 | 0 | 0 | 0 | 0 | 0 | 0 | 0 |

FLAG { 0 : NON COINCIDENCE
       1 : COINCIDENCE

F I G. 5 C

SEMICONDUCTOR MEMORY DISK APPARATUS WITH BACKUP DEVICE CAPABLE OF BEING ACCESSED IMMEDIATELY AFTER POWER SOURCE IS RECOVERED

BACKGROUND OF THE INVENTION

1. Field of the Invention

The present invention relates to a semiconductor memory disk apparatus which comprises a volatile semiconductor memory and a backup device for saving data stored in the semiconductor memory when a power source is downed or turned off and, more particularly, to a method of immediately executing ar external input/output command during a restore operation of data from a backup device to a semiconductor memory and a semiconductor memory disk apparatus for realizing the method.

2. Description of Related Art

In recent years, an apparatus using a semiconductor memory as a kind of disk device, i.e., a semiconductor memory disk apparatus has been developed. Since a semiconductor memory disk apparatus of this type employs a semiconductor memory as its storage medium, it does not require a mechanical operation (unlike a magnetic disk or tape device), thus allowing a high-speed operation. However, a volatile semiconductor memory is used as the storage medium due to its cost. Therefore, the memory must be backed up when an AC power source is downed or turned off upon a power failure or the like. In the conventional semiconductor memory disk apparatus, a battery power source for backup when the power source is OFF is prepared. When the power source is OFF, data stored in the semiconductor memory is saved in a backup device using the battery power source.

In the semiconductor memory disk apparatus as described above, as shown in FIG. 1A, when the power source is recovered, a restore operation for restoring the data saved in the backup device to the semiconductor memory is started contrary to the power OFF state. In this case, as shown in FIG. 1B, since the content of the semiconductor memory does not coincide with that in a backup device until the restore operation is completed, execution of an input/output command input from an external CPU is inhibited. The restore operation requires several minutes since the backup device normally comprises a magnetic disk device or a magnetic tape device. Therefore, it takes a long period of time until the CPU is available after the power source is recovered.

SUMMARY OF THE INVENTION

The present invention has been made in consideration of the above situation, and has as its object to provide a method of immediately executing an externally input/output command during a restore operation of data from a backup device to a semiconductor memory and a semiconductor memory disk apparatus.

In order to achieve the above object, a semiconductor memory disk apparatus includes a volatile semiconductor memory disk for storing first block data, a nonvolatile backup device for storing second block data, a directory memory including flags, the flags indicating whether or not the first block data in the semiconductor memory disk coincide with the second block data in the backup device in units of blocks and being set when these data coincide with each other, a restore section for restoring the second block data in the backup device as the first block data to the semiconductor memory disk when an AC power source is recovered, an access section for, when an access command is input during a restore operation by the restore section, causing the restore section to interrupt the restore operation and access one of the semiconductor memory disk and the backup device in accordance with a flag in the directory memory corresponding to a block designated by the access command, and a directory memory managing section for managing the fags in the directory memory in accordance with the access operation by the access section and the restore operation by the restore section.

In order to achieve the above object, a method comprises the steps of:
- restoring block data stored in a backup device to a semiconductor memory disk when an AC power source is turned on;
- interrupting a restore operation in response to an access command generated during the restore operation;
- accessing one of the semiconductor memory disk and the backup device in accordance with a flag corresponding to a block designated by the access command so as to read out block data, the flag indicating whether or not correct block data is stored in a corresponding block of the semiconductor memory disk; and
- restarting the restore operation upon completion of the access operation.

As described above, according to the present invention, when a power switch is turned on or when a power source is recovered, even if an external input/output command is issued during a restore operation from the backup device to the semiconductor memory, the command can be immediately executed. In this manner, in the semiconductor memory disk apparatus of the present invention, since a time required for the restore operation can be essentially reduced to zero, the system rise time can be shortened. Furthermore, according to the present invention, when an input command is input and when the flag in the directory memory corresponding to a designated block indicates that designated block data in the semiconductor memory coincides with block data of the corresponding block, the designated block data can be read out from the semiconductor memory at high speed as for the input command in a normal state.

BRIEF DESCRIPTION OF THE DRAWINGS

FIGS. 5A to 5C are views for explaining a correspondence among a backup device, a semiconductor memory, and flags in a directory memory shown in FIG. 2 in units of blocks; and FIGS. 6A and 6B are views for explaining the operation of the semiconductor memory disk apparatus of the present invention.

DETAILED DESCRIPTION OF THE PREFERRED EMBODIMENT

A semiconductor memory disk apparatus according to the present invention will now be described in detail with reference to the accompanying drawings.

Figure 1:
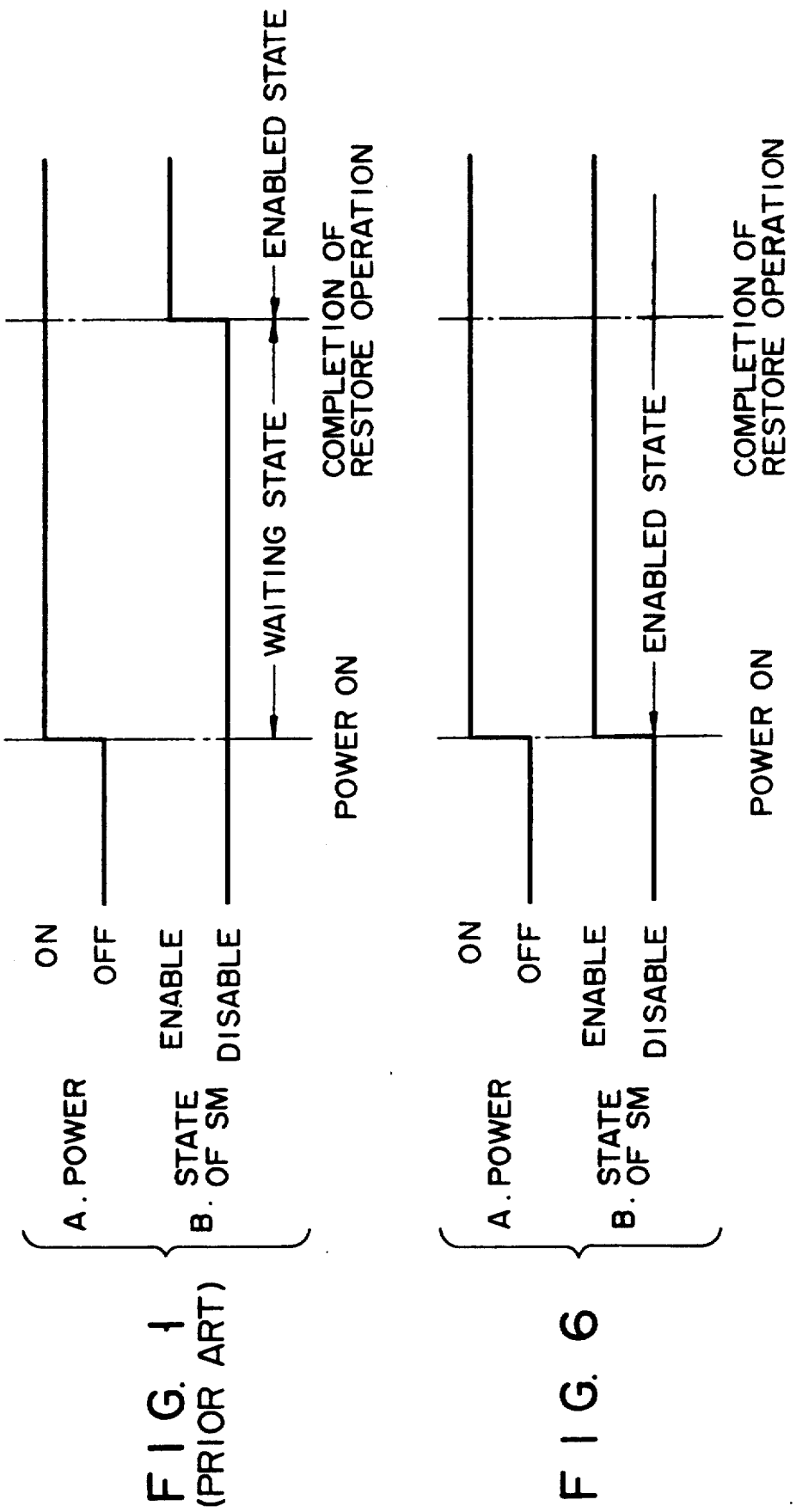
FIGS. 1A and 1B are timing charts for explaining an operation of a conventional semiconductor memory disk apparatus.
Figure 2:
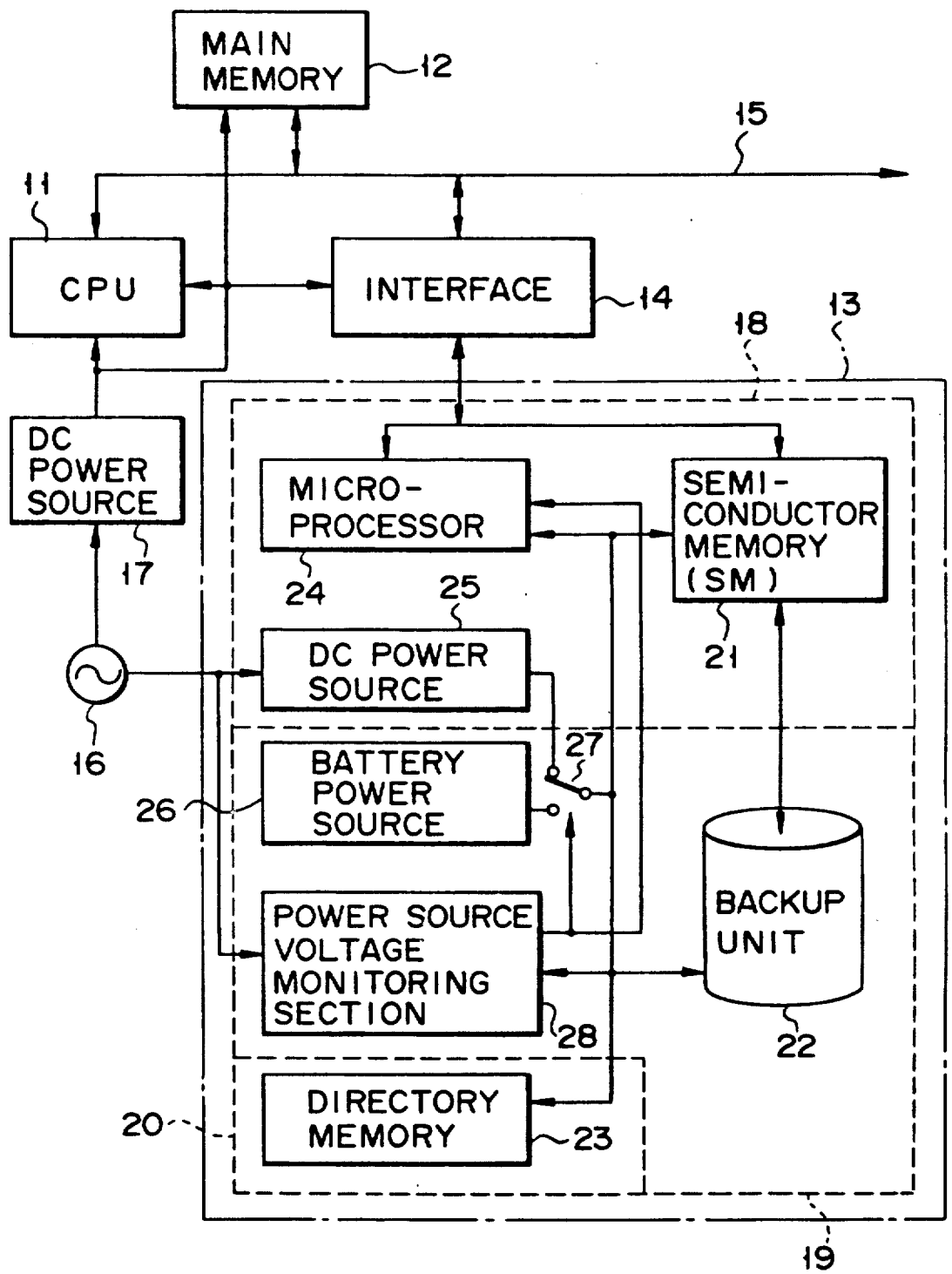
FIG. 2 is a block diagram showing an arrangement of a semiconductor memory disk apparatus according to an embodiment of the present invention.

An embodiment of an information processing system to which the semiconductor memory disk apparatus of the present invention is applied will be described below with reference to FIG. 2. A CPU 11 controls the entire system. A main memory 12 stores various data, programs, and the like including CCWs (channel command words). The CPU 11, the main memory 12, and an interface 14 of a semiconductor memory disk apparatus 13 are connected to a high-speed system bus 15. A DC power source 17 generates a stabilized DC voltage on the basis of an AC voltage from an AC power source 16. The CPU 11 generates an input/output start command, and outputs it to the semiconductor memory disk apparatus 13. The semiconductor memory disk apparatus 13 reads out a CCW designated by the input/output start command from the main memory 12. The apparatus 13 reads out block data from the main memory 12 or writes block data in the main memory 12 in accordance with the readout CCW.

The semiconductor memory disk apparatus 13 comprises a semiconductor disk section 18, a backup section 19, and a backup indication section 20. The semiconductor disk section 18 comprises a semiconductor memory 21, a microprocessor 24, and a DC power source 25. The semiconductor memory (SM) 21 comprises a volatile semiconductor memory, such as a RAM, and has a storage capacity of, e.g., 100 Kbytes, as shown in FIG. 5B. The storage area of the semiconductor memory 21 is divided into 50 blocks in units of 2 Kbytes. The 50 blocks are serially numbered from "1" to "50". The microprocessor 24 controls the operation of overall the semiconductor memory disk apparatus 13, and especially, performs input/output control requested by an input/output start command from the CPU 11. Furthermore, the microprocessor 24 controls a restore or save operation in response to an input AC power source ON or OFF acknowledge signal and in accordance with the content of a directory memory (to be described later). The DC power source 25 generates a stabilized DC voltage on the basis of an AC voltage from the AC power source 16 like the DC power source 17, and supplies the generated DC voltage to the respective sections of the semiconductor memory disk apparatus 13, e.g., the microprocessor 24, the semiconductor memory 21, and the like.

The backup section 19 comprises a battery power source 26, a backup unit 22, a switch 27, and a power source voltage monitoring section 28. The battery power source 26 serves as a DC backup power source of the DC power source 25. The switch 27 switches the power source from the DC power source 25 to the battery power source 26 in response to the input AC power source OFF acknowledge signal, and switches the power source from the battery power source 26 to the DC power source 25 in response to the input AC power source ON acknowledge signal to supply a DC voltage to the respective sections of the semiconductor memory disk apparatus 13. The power source voltage monitoring section 28 monitors a power source voltage. When the section 28 detects that a voltage from the AC power source 16 is decreased below a predetermined value, it generates the AC power source OFF acknowledge edge signal, and when it detects that the AC power source voltage is recovered to be higher than the predetermined value, it generates the AC power source ON acknowledge signal. The section 2 supplies these signals to the switch 27 and the microprocessor 24. The backup unit 22 saves block data stored in the semiconductor memory 21 when the power source is turned off, and comprises a magnetic disk device, a magnetic tape device (magnetic tape streamer), or the like. As shown in FIG. 5A, the storage capacity of the backup unit 22 is 100 Kbytes which is equal to that of the semiconductor memory 21. Blocks of the storage area of the unit 22 are numbered in the same manner as in the semiconductor memory 21.

The backup indication section 20 includes the directory memory 23 indicating whether or not block data stored in the semiconductor memory 21 coincide with those stored in the backup unit 22 in units of blocks. The storage capacity of the directory memory 23 is 50 bytes. As shown in FIG. 5C, a predetermined bit of each byte indicates, as a flag, a coincidence/noncoincidence between block data of the corresponding blocks of the semiconductor memory 21 and the backup unit 22 by logic "1"/"0".

Figure 3:
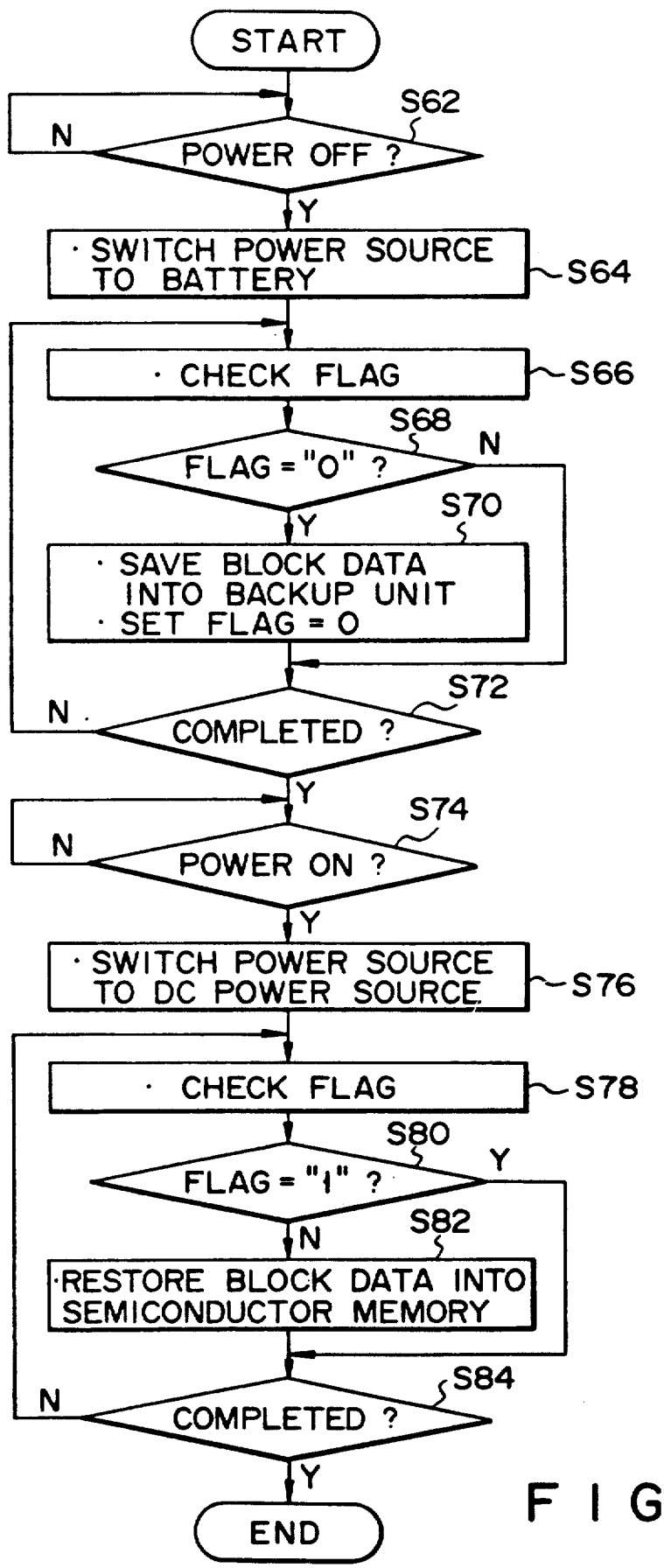
FIGS. 3 and 4 are flow charts for explaining the operation of the embodiment shown in FIG. 2.

The operation of this embodiment will be described below with reference to FIGS. 3 and 4.

A save operation from the semiconductor memory 21 to the backup unit 22 when the AC power source is turned off and a restore operation when the AC power source is turned on thereafter will be described below with reference to FIG. 3.

In step S62, when supply of an AC voltage from the AC power source 16 to the DC power source 25 in the semiconductor memory disk apparatus 13 is cut off, the power source voltage monitoring section 28 generates the AC power source OFF acknowledge signal, and outputs it to the switch 27 and the microprocessor 24. In step S64, the switch 27 switches a power source from the DC power source 25 to the battery power source 26 in response to the AC power source OFF acknowledge signal. Thus, the DC voltage from the battery power source 26 is supplied to the respective sections in the semiconductor memory disk apparatus 13. The microprocessor 24 executes the save operation from steps S66 to steps S72 in response to the AC power source OFF acknowledge signal. More specifically, whether a flag of block 1 of the directory memory 23 is "0" is checked in step S66. If N in step S68, i.e., if it is determined that the flag is at logic "1", step S72 is executed. However, if Y in step S68, step S70 is executed, and block data stored in block 1 of the semiconductor memory 21 is saved in the backup unit 22. Thereafter, the flag of block 1 of the directory memory 23 is set at logic "1". Subsequently, it is checked in step S72 if processing for block 50 is completed. If N in step S72, step S66 is executed for the next block.

In this embodiment, only block data stored in blocks corresponding to flags of logic "0" in the directory memory 23 are saved in the backup unit 22. However, all the block data may be saved. Alternatively, the number of flags of logic "0" may be detected. If the number is equal to or smaller than a predetermined value, block data corresponding to these flags may be saved in the backup unit 22; otherwise, all the bock data may be saved. That is, in this embodiment, when write access of block data from the backup unit 22 to the semiconductor memory 21 is performed in response to the input/output start command from the CPU 11, the flag in the directory memory 23 corresponding to a block designated by the input/output start command must be rewritten to logic "1". In this case, the number of flags rewritten to logic "1" is counted. If the number of rewritten flags is equal to or smaller than the predetermined value (e.g., ¼ or less of the total number of flags in the directory memory 23), the save operation may be performed for blocks corresponding to "1" flags; otherwise, the save operation may be performed for all the blocks.

If the AC power source 16 is recovered to an ON state in step S74, the power source voltage monitoring section 28 detects it, and generates the AC power source ON acknowledge signal. The section 28 supplies the signal to the switch 27 and the microprocessor 24. The switch 27 switches a power source from the battery power source 26 to the DC power source 25 in step S76. As a result, the DC voltage is supplied from the DC power source 25 to the semiconductor memory 21, the backup unit 22, the directory memory 23, the microprocessor 24, and the like through the switch 27. The DC voltage is supplied from the DC power source 17 to the CPU 11, the main memory 12, and the interface 14. When the microprocessor 24 receives the AC power source ON acknowledge signal from the power source voltage monitoring section 28, it initializes the flags of all the blocks of the directory memory 23 to logic "0". More specifically, the directory memory 23 is set in a state wherein contents of the corresponding blocks of the backup unit 22 and the semiconductor memory 21 do not coincide with each other.

In step S78, the microprocessor 24 checks whether a flag of a block as a present processing target is "1". If Y in step S80, i.e., if it is determined that the flag is at logic "1", step S84 is directly executed. However, if N in step S80, step S82 is executed. In step S82, the microprocessor 24 restores block data of the block as the present processing target from the backup unit 22 to the semiconductor memory 21 block by block. The restore operation may be performed in units of a plurality of blocks. The flag in the director memory 23 corresponding to the block for which the restore operation is completed is set to logic "1". It is checked in step S84 if the restore operation of all the block data is completed. If N in step S84, step S78 is executed for the next block. As described above, the restore operation is executed.

Figure 4:
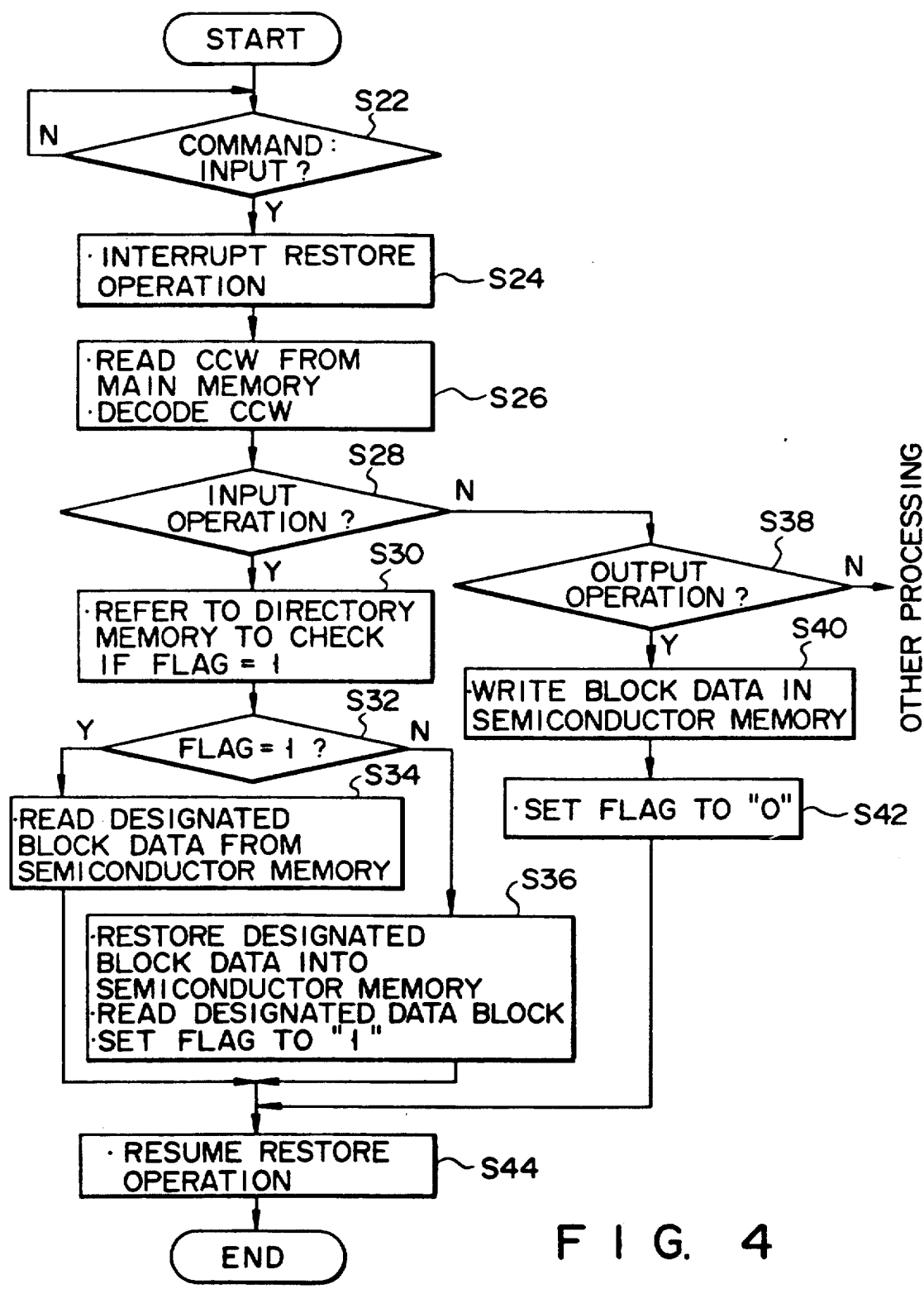

During the restore operation, if an input/output start command is issued from the CPU 11, the command is input to the microprocessor 24 of the semiconductor memory disk apparatus 13 through the interface 14 in step S22 in FIG. 4. The microprocessor 24 interrupts the restore operation from the backup unit 22 to the semiconductor memory 21 in step S24. Thereafter, the microprocessor 24 fetches a CCW (channel command word) from an area in the main memory 12 indicated by the input/output start command through the high-speed bus 15 and the interface 14, and decodes the fetched CCW, in step S26. As a result of decoding if it is determined in step S2B that an input operation from the semiconductor memory 21 to the main memory 12 is designated, whether or not designated block data is present in the semiconductor memory 21 is checked on the basis of a flag in the directory memory 23 corresponding to the designated block in step S30.

If Y in step S32, that is, if the state of the referred flag is logic "1", the microprocessor 24 reads out the designated block data from the semiconductor memory 21 and transfers it to the main memory 12 through the interface 14 and the high-speed bus 15 in step S34 in the same manner as in the input operation in a normal state. In contrast to this, if N in step S32, i.e., if the referred flag is at logic "0", the designated block data is not present in the semiconductor memory 21. Therefore, the designated block data is transferred from the backup unit 22 to the semiconductor memory 21 to be stored therein in step S36 in the same manner as in the restore operation. At the same time, the designated block data is transferred to the main memory 12 through the interface 14 and the high-speed bus 15. Upon completion of this data transfer operation, the microprocessor 24 sets the flag in the directory memory 23 corresponding to the requested block to logic "1". Thus, when an input/output start command requesting an input operation for the above-mentioned block is generated again during the restore operation, data of the designated block can be immediately read out from the semiconductor memory 21, and can be transferred to the main memory 12.

Thereafter, in step S44, the restore operation from the backup unit 22 to the semiconductor memory 21 is restarted.

As a result of decoding of the CCW in step S26, if it is determined that the output operation is designated by the input/output command, Y is determined in step S38. If N in step S38, other processing is executed. After step S38, step S40 is executed, and the microprocessor 24 executes write access. Block data from the main memory 12 is written in the designated block in the semiconductor memory 21. In step S42, the microprocessor 24 sets the flag in the directory memory 23 corresponding to the designated block to logic "0". Thereafter, step S44 is executed.

In step S40, when block data is written in the semiconductor memory 21, it may be simultaneously written in a corresponding block of the backup unit 22 as a write-through operation. In this case, the corresponding flag must be set to logic "1" in step S42.

When an input command is generated for the above-mentioned block as a target again during the restore operation, the requested block data can be immediately read out from the semiconductor memory 21 and can be transferred.

As described above, as shown in FIGS. 6A and 6B, the restore operation from the semiconductor memory 21 to the backup unit 22 and the input/output operation requested by the input/output start command from the CPU 11 can be performed almost parallel to each other. When the restore operation is then completed, processing in the semiconductor memory disk apparatus 13 in response to the input/output start command from the CPU 11 is executed for the semiconductor memory 21. In this case, when write access is executed for block data stored in the semiconductor memory 21, the corresponding flag is set to logic "0".

While the invention has been described in terms of certain preferred embodiments, the skilled worker practiced in the art will recognize that there are various changes, modifications, omissions and substitutions that may be made without departing from the spirit thereof.

What is claimed is:

1. A semiconductor memory disk apparatus capable of performing access without a wait time when an AC power source is turned on, comprising:
   semiconductor memory means for storing first block data, said semiconductor memory means being volatile;

backup means for storing second block data, said backup means being nonvolatile;

directory memory means including flags, the flags indicating whether or not the first block data in said semiconductor memory means coincide with the second block data in said backup means in units of blocks and being set when these data coincide with each other;

restore means for restoring the second block data in said backup means as the first block data to said semiconductor memory means when an AC power source is recovered;

access means for, when an access command is input during a restore operation by said restore means, interrupting the restore operation by said restore means and selectively accessing either said semiconductor memory means or said backup means in accordance with the flag in said directory memory means corresponding to a block designated by the access command; and directory memory managing means for managing the flags in said directory memory means in accordance with an access operation by said access means and the restore operation by said restore means.

2. An apparatus according to claim 1, wherein said access means includes:

means for, when the access command is a read command and the flag in said directory memory corresponding to a block designated by the access command is set, reading out the first block data from a block in said semiconductor memory means corresponding to the designated block, and for, when the access command is the read command and the flag in said directory memory means corresponding to the designated block in not set, reading out the second block data from a block in said backup means corresponding to the designated block.

3. An apparatus according to claim 2, wherein said access means further comprises means for, when the access command is a read command and the flag in said directory memory means corresponding to a block designated by the access command is not set, writing the second block data red out from said backup means as the first block data in the corresponding block of said semiconductor memory means, and said directory memory managing means includes means for, when the access command is the read command and the flag in said directory memory mean corresponding to the designated block is not set, setting the corresponding flag after a read operation by said access means.

4. An apparatus according to claim 1, wherein said access means includes:

means for writing block data in a block in said semiconductor memory means corresponding to a block designated by an access command, and said directory memory managing means includes means for resetting the flag corresponding to the designated block.

5. An apparatus according to claim 4, wherein said access means further comprises:

means for, when the access command is a write command, simultaneously writing block data as the first and second block data in said semiconductor memory means and said backup means, and said directory memory managing means includes:

means for, when the block data is written in said semiconductor memory means and said backup means, setting the corresponding flag.

6. An apparatus according to claim 1, wherein said access means further comprises:

means for, when a write command is input after the restore operation by said restore means is completed, writing block data in said semiconductor memory means, and said directory memory managing means include means for, when the block data is written in said semiconductor memory means, resetting the corresponding flag.

7. An apparatus according to claim 1, wherein said restore means further includes:

means for selectively restoring the second block data as the first block data from said backup means to said semiconductor memory means in accordance with corresponding flags.

8. An apparatus according to claim 1, further comprising:

means for saving the block data from said semiconductor memory means to said backup means when the power source is downed.

9. An apparatus according to claim 8, wherein said save means further includes:

means for saving the block data from said semiconductor memory means to said backup means in accordance with the corresponding flag of said directory memory means when the power source is downed.

10. A method of allowing access of a volatile semiconductor memory disk without a wait time when an AC power source is turned on in a semiconductor memory disk apparatus, comprising the steps of:

restoring block data stored in a backup device to said semiconductor memory disk when the AC power source is turned on;

interrupting restoration of the block data in response to an access command generated during the block data is restored;

selectively accessing either said semiconductor memory disk or said backup device in accordance with a flag corresponding to a block designated by the access command so as to read out block data, the flag indicating whether or not correct block data is stored in a corresponding block of said semiconductor memory disk; and restarting the access operation upon completion of the access operation.

11. A method according to claim 10, wherein the access step includes the steps of:

reading out, when the access command is a read command and the flag corresponding to a block designated by the access command is set, the block data from a block in said semiconductor memory disk corresponding to the designated block; and reading out the block from a block in said backup device corresponding to the designated block when the access command is the read command and the flag corresponding to the designated block is not set.

12. A method according to claim 10, wherein the access step includes the steps of:

writing the block data read out from said backup device into a block in said semiconductor memory disk corresponding to a block designated by the access command when the access command is the read command and the corresponding flag after the read access.

13. A method according to claim 10, wherein the access step includes the steps of:
    writing the block data in the designated block of said semiconductor memory disk when the access command is a write command; and
    resetting the flag corresponding to the designated block.

14. A method according to claim 13, wherein the access step further comprises the steps of:
    simultaneously writing block data in said semiconductor memory disk and said backup device when the access command is the write command; and
    setting the corresponding flag.

15. A method according to claim 10, wherein the access step further comprises the steps of:
    writing the block data in said semiconductor memory disk when a write command is input after the restore operation is completed; and
    resetting the corresponding flag.

16. A method according to claim 10, wherein the restore step further includes the steps:
    selectively restoring data from said backup device to said semiconductor memory disk in accordance with the corresponding flags.

17. A method according to claim 10, further comprising the step of:
    saving the block data from said semiconductor memory disk to said backup device when the power source is turned off.

18. A method according to claim 17, wherein the save step further includes the step of:
    saving the block data from said semiconductor memory disk to said backup device in accordance with the corresponding flag when the power source is turned off.

* * * * *